(12) United States Patent
Wang et al.

(10) Patent No.: US 11,215,857 B2
(45) Date of Patent: Jan. 4, 2022

(54) DOUBLE-SIDED DISPLAY PANEL AND DISPLAY DEVICE

(71) Applicant: Shanghai Tianma AM-OLED Co., Ltd., Shanghai (CN)

(72) Inventors: Xue Wang, Shanghai (CN); Zhiyong Xiong, Shanghai (CN); Liujing Fan, Shanghai (CN); Ping An, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/722,500

(22) Filed: Dec. 20, 2019

(65) Prior Publication Data

US 2021/0063784 A1 Mar. 4, 2021

(30) Foreign Application Priority Data

Aug. 30, 2019 (CN) .......................... 201910818364.3

(51) Int. Cl.
| | |
|---|---|
| *G02F 1/1333* | (2006.01) |
| *F21V 8/00* | (2006.01) |
| *G02F 1/1335* | (2006.01) |
| *H01L 27/32* | (2006.01) |
| *H01L 51/52* | (2006.01) |

(52) U.S. Cl.
CPC .......... *G02F 1/1333* (2013.01); *G02B 6/005* (2013.01); *G02B 6/0068* (2013.01); *G02B 6/0073* (2013.01); *G02F 1/133512* (2013.01); *H01L 27/322* (2013.01); *H01L 27/3272* (2013.01); *H01L 51/5206* (2013.01); *H01L 51/5234* (2013.01); *H01L 51/5284* (2013.01); *G02F 1/133342* (2021.01); *H01L 2251/5323* (2013.01)

(58) Field of Classification Search
None
See application file for complete search history.

(56) References Cited

U.S. PATENT DOCUMENTS

| | | | |
|---|---|---|---|
| 2012/0169967 A1* | 7/2012 | Han | G02B 6/0076 349/62 |
| 2015/0130738 A1* | 5/2015 | Park | G06F 1/1694 345/173 |
| 2016/0306215 A1* | 10/2016 | Chen | G02F 1/133514 |
| 2017/0162829 A1* | 6/2017 | Lai | H01L 51/5234 |
| 2017/0179087 A1* | 6/2017 | Kang | H01L 27/32 |
| 2019/0081122 A1* | 3/2019 | Kim | H01L 27/3248 |
| 2020/0040255 A1* | 2/2020 | Park | H01L 27/322 |

FOREIGN PATENT DOCUMENTS

| | | |
|---|---|---|
| CN | 103915481 A | 7/2014 |
| CN | 108459442 A | 8/2018 |
| CN | 108628036 A | 10/2018 |

* cited by examiner

*Primary Examiner* — Shan Liu
(74) *Attorney, Agent, or Firm* — von Briesen & Roper, s.c.

(57) ABSTRACT

Provided are a double-sided display panel and display device. The double-sided display panel includes a light-emitting module, a first conversion panel and a second conversion panel, where the light-emitting module is placed between the first conversion panel and the second conversion panel, and the light-emitting module may provide light sources for the first conversion panel and the second conversion panel to cause the first conversion panel and/or the second conversion panel to display an image.

20 Claims, 7 Drawing Sheets

DOUBLE-SIDED DISPLAY PANEL AND DISPLAY DEVICE

CROSS-REFERENCE TO RELATED APPLICATIONS

This application claims priority to Chinese patent application No. 201910818361.3, entitled "Double-sided Display Panel And Display Device" and filed on Aug. 30, 2019, the disclosure of which is incorporated therein by reference in its entirety.

TECHNICAL FIELD

The present disclosure relates to the field of display techniques and, in particular, relates to a double-sided display panel and display device.

BACKGROUND

With the development of science and technology, display devices play a more and more important role in current electronic devices. A current display device usually has a light-emitting surface and a backside surface facing away from the light-emitting surface. The light-emitting surface is capable of displaying information such as images, text and the like, while display cannot be performed on the backside surface, that is, display can be performed on a single side of the display device.

At present, bidirectional display is needed in window industries such as a communication industry, a government window, a financial industry, a transportation industry and the like, so that displayed information can be viewed by people inside and outside the window. In the related art, two display screens are disposed in the display device, and the two display screens face towards different directions, so that the display device is capable of achieving the bidirectional display. Although the bidirectional display can be achieved by using the two display screens, the display device will have a large volume, a thick thickness, a complex structure, and development requirements of a light, thin and small display device cannot be met.

SUMMARY

Embodiments of the present disclosure provide a double-sided display panel and display device, so that the double-sided display panel has a simple structure and meets a development trend of the light and thin display panel.

In a first aspect, embodiments of the present disclosure provide a double-sided display panel including a first conversion panel, a second conversion panel, and a light-emitting module placed between the first conversion panel and the second conversion panel.

The light-emitting module includes a plurality of light-emitting units, and the light-emitting module is configured to provide a light source for the first conversion panel and/or the second conversion panel.

The first conversion panel includes a first blocking layer, a first light shielding layer and a plurality of first conversion patterns, where the first light shielding layer is located on a side of the first blocking layer facing away from the second conversion panel and includes a plurality of first opening structures, the plurality of first conversion patterns are located in the plurality of first opening structures, and each first conversion pattern corresponds to at least one light-emitting unit.

The second conversion panel includes a second blocking layer, a second light shielding layer and a plurality of second conversion patterns, where the second light shielding layer is located on a side of the second blocking layer facing away from the first conversion panel and includes a plurality of second opening structures, the plurality of second conversion patterns are located in the plurality of second opening structures, and each second conversion pattern corresponds to at least one light-emitting unit.

The first blocking layer is configured to block light of a first color emitted from the light-emitting units, the first conversion pattern is configured to perform color conversion on light penetrating the first blocking layer, the second blocking layer is configured to block light of a second color emitted from the light-emitting units, and the second conversion pattern is configured to perform color conversion on light penetrating the second blocking layer.

In a second aspect, embodiments of the present disclosure provide a display device including the above display panel.

The embodiments of the present disclosure provide a double-sided display panel and display device. A light-emitting module of the double-sided display panel includes a plurality of light-emitting units and provides a light source for a first conversion panel and a second conversion panel. A first blocking layer of the first conversion panel is capable of blocking light of a first color emitted from the light-emitting unit and color conversion is performed through a first conversion pattern on light penetrating the first blocking layer. A second blocking layer of the second conversion panel is capable of blocking light of a second color emitted from the light-emitting unit and color conversion is performed through a second conversion pattern on light penetrating the second conversion panel. The light-emitting module of the double-sided display panel provided in the embodiments of the present disclosure is capable of providing light sources for the first conversion panel and the second conversion panel, respectively, so that corresponding images can be displayed on a light exit surface of the first conversion panel and a light exit surface of the second conversion panel, respectively. Therefore, compared with the double-screen display in the related art, the double-sided display panel has a simple structure and can meet the development requirements of a light, thin and small display device. Simultaneously, in the double-sided display panel provided in the embodiments of the present disclosure, the first blocking layer of the first conversion panel is capable of blocking the light of the first color emitted from the light-emitting units, and the second blocking layer of the second conversion panel is capable of blocking the light of the second color emitted from the light-emitting units. When the light-emitting unit is configured to emit light of the first color, the light emitted can penetrate the second blocking layer of the second conversion panel and fails to penetrate the first blocking layer of the first conversion panel, so that an image is displayed on the light exit surface of the second conversion panel. Alternatively, when the light-emitting unit is configured to emit light of the second color, the light emitted can penetrate the first blocking layer of the first conversion panel and fails to penetrate the second blocking layer of the second conversion panel, so that an image can be displayed on the light exit surface of the first conversion panel. Therefore, the double-sided display panel has a function of single-sided display. In addition, when the light-emitting unit emits light of the first color and the second color, or the light-emitting unit emits light of another color other than the first color and the second color, the light emitted from the light-emitting unit can penetrate not only the first blocking layer of the first conversion panel but also the second blocking layer of the second conversion panel, and thereby images can be displayed on the light exit surface of the first conversion panel and the light exit surface of the second conversion panel simultaneously, and the double-sided display panel achieves double-sided display.

DETAILED DESCRIPTION

Figure 1:
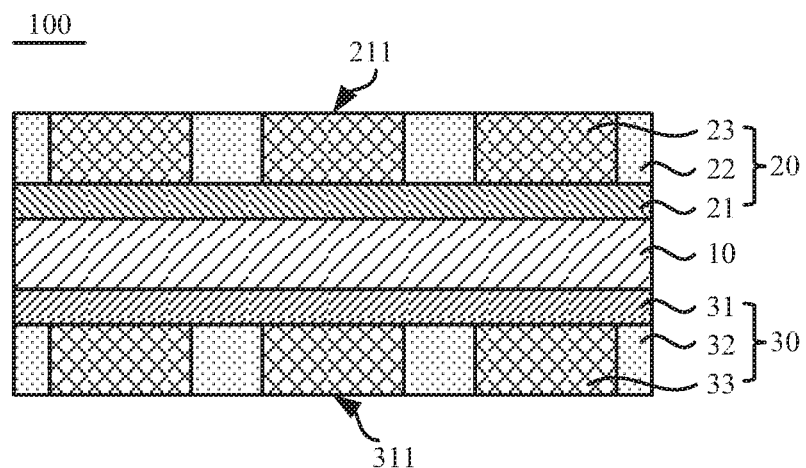
FIG. 1 is a schematic diagram illustrating a film layer structure of a double-sided display panel according to an embodiment of the present disclosure.

Hereinafter the present disclosure will be father described in detail in conjunction with the drawings and embodiments. It is to be understood that the specific embodiments set forth below are merely intended to illustrate and not to limit the present disclosure. Additionally, it is to be noted that, for ease of description, only part, not all, of the structures related to the present disclosure are illustrated in the drawings.

In the related art, a double-sided display device usually includes a first display screen and a second display screen, and a display surface of the first display screen may face away from a display surface of the second display screen, so that information displayed by the double-sided display device can be displayed on not only the display surface of the first display screen but also the display surface of the second display screen, and thereby the double-sided display device is capable of achieving double-sided display. However, the double-sided display panel in the related art includes the first display screen and the second display screen, so that the display device will have a large volume and a complex structure, and thereby development requirements of a light, thin and small display device cannot be met.

In order to solve the above technical problems, embodiments of the present disclosure provide a double-sided display panel including a first conversion panel, a second conversion panel, and a light-emitting module placed between the first conversion panel and the second conversion panel.

The light-emitting module includes a plurality of light-emitting units, and the light-emitting module is configured to provide a light source for the first conversion panel and/or the second conversion panel.

The first conversion panel includes a first blocking layer, a first light shielding layer and a plurality of first conversion patterns. The first light shielding layer is located on a side of the first blocking layer facing away from the second conversion panel and includes a plurality of first opening structures, the plurality of first conversion patterns are located in the plurality of first opening structures, and each first conversion pattern corresponds to at least one light-emitting unit.

The second conversion panel includes a second blocking layer, a second light shielding layer and a plurality of second conversion patterns. The second light shielding layer is located on a side of the second blocking layer facing away from the first conversion panel and includes a plurality of second opening structures, the plurality of second conversion patterns are located in the plurality of second opening structures, and each second conversion pattern corresponds to at least one light-emitting unit.

The first blocking layer is configured to block light of a first color emitted from the plurality of light-emitting units, the first conversion patterns are configured to perform color conversion on light penetrating the first blocking layer, the second blocking layer is configured to block light of a second color emitted from the plurality of light-emitting units, and the second conversion patterns are configured to perform color conversion on light penetrating the second blocking layer.

In a first aspect, through the above technical solution, the light-emitting module of the double-sided display panel is capable of providing the light sources for the first conversion panel and the second conversion panel, respectively, so that corresponding images can be displayed on a light exit surface of the first conversion panel and a light exit surface of the second conversion panel, respectively, and thereby compared with the double-screen display in the related art, the double-sided display panel has a simple structure and can meet development requirements of a light, thin and small display device. In a second aspect, though the above technical solution, in the double-sided display panel, the first blocking layer of the first conversion panel is capable of blocking the light of the first color emitted from the light-emitting units, and the second blocking layer of the second conversion panel is capable of blocking the light of the second color emitted from the light-emitting units. When the light-emitting units are configured to emit light of the first color, the light emitted from the light-emitting units can penetrate the second blocking layer of the second conversion panel and cannot penetrate the first blocking layer of the first conversion panel, so that an image is displayed on the light exit surface of the second conversion panel. Alternatively, when the light-emitting units are configured to emit light of the second color, the light emitted from the light-emitting units can penetrate the first blocking layer of the first conversion panel and cannot penetrate the second blocking layer of the second conversion panel, so that an image is displayed on the light exit surface of the first conversion panel. Therefore, the double-sided display panel has a function of single-sided display. In addition, when the light-emitting units are configured to emit light of the first color and the second color, or the light-emitting units are configured to emit light of another color other than the first color and the second color, the light emitted from the light emitting unit can penetrate not only the first blocking layer of the first conversion panel but also the second blocking layer of the second conversion panel, and thereby images can be simultaneously displayed on the light exit surface of the first conversion panel and the light exit surface of the second conversion panel, and the double-sided display panel achieves double-sided display.

The above is a core idea of the present disclosure, and technical solutions in the embodiments of the present disclosure will be described clearly and completely in conjunction with drawings in the embodiments of the present disclosure. Based on the embodiments of the present disclosure, all other embodiments obtained by those skilled in the art without creative work are within the scope of the present disclosure.

Figure 2:
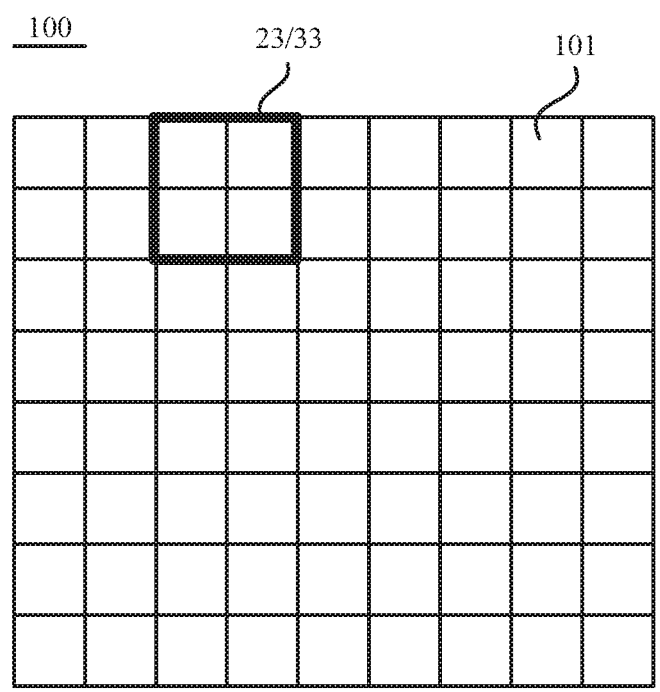
FIG. 2 is a top view of a double-sided display panel according to an embodiment of the present disclosure.

FIG. 1 is a schematic diagram illustrating a film layer structure of a double-sided display panel according to an embodiment of the present disclosure, and FIG. 2 is a top view of a double-sided display panel according to an embodiment of the present disclosure. Referring to FIGS. 1 and 2, a double-sided display panel 100 provided in the embodiments of the present disclosure includes a first conversion panel 20, a second conversion panel 30, and a light-emitting module 10 placed between the first conversion panel 20 and the second conversion panel 30. The light-emitting module 10 includes a plurality of light-emitting units 101. Light emitted from the light-emitting unit 101 is capable of providing a light source for the first conversion panel 20 and/or the second conversion panel 30, that is, when the light-emitting module 10 provides a light source for the first conversion panel 20, the double-sided display panel 100 is capable of achieving top light-emitting, when the light-emitting module 10 provides a light source for the second conversion panel 30, the double-sided display panel 100 is capable of achieving bottom light-emitting, and when the light-emitting module 10 simultaneously provides light sources for the first conversion panel 20 and the second conversion panel 30, the double-sided display panel 100 is capable of achieving the top light-emitting and the bottom light-emitting simultaneously, that is, the double-sided display panel 100 achieves double-sided light-emitting.

The first conversion panel 20 is provided with a first blocking layer 21, a first light shielding layer 22 and a plurality of first conversion patterns 23. The first light shielding layer 22 is located on a side of the first blocking layer 21 facing away from the second conversion panel 30 and includes a plurality of first opening structures. The plurality of first conversion patterns 23 are located in the plurality of first opening structures of the first light shielding layer 22, and each first conversion pattern 23 corresponds to at least one light-emitting unit 101 of the light-emitting module 10. The first blocking layer 21 of the first conversion panel 20 is capable of blocking light of a first color, and the first light shielding layer 22 is capable of shielding light at a position where light is not required to be emitted in the first conversion panel 20, preventing color mixing and improving the display contrast. The first conversion patterns 23 are capable of performing color conversion on light penetrating the first blocking layer 21. When the light-emitting units 101 are configured to emit light of another color other than the first color, light emitted from the light-emitting units 101 is capable of penetrating the first blocking layer 21, and the first conversion patterns 23 perform color conversion on the light penetrating the first blocking layer 21, so that a color image can be displayed on a light exit surface 211 of the first conversion panel 20, and the double-sided display panel 100 achieves top light emission.

The second conversion panel 30 is provided with a second blocking layer 31, a second light shielding layer 32 and a plurality of second conversion patterns 33. The second light shielding layer 32 is located on a side of the second blocking layer 31 facing away from the first conversion panel 20 and includes a plurality of second opening structures. The plurality of second conversion patterns 33 are located in the plurality of second opening structures, and each of the second conversion pattern 33 corresponds to at least one light-emitting unit 101 of the light-emitting module 10. The second blocking layer 31 of the second conversion panel 30 is capable of blocking light of a second color, and the second light shielding layer 32 is capable of shielding light at a position where light is not required to be emitted in the second conversion panel 30, preventing color mixing and improving the display contrast. The second conversion patterns 33 are capable of performing color conversion on light penetrating the second blocking layer 31. When the light-emitting units 101 are configured to emit light of another color other than the second color, light emitted from the light-emitting units 101 is capable of penetrating the second blocking layer 31, and the second conversion patterns 33 perform color conversion on the light penetrating the second blocking layer 31, so that a color image is displayed on a light exit surface 311 of the second conversion panel 30, and the double-sided display panel 100 achieves bottom light emission.

When the light-emitting units 101 in the light-emitting module 10 are configured to emit light of the first color and the second color, the light of the second color is capable of penetrating the first blocking layer 21, the light of the first color is capable of penetrating the second blocking layer 31, the first conversion patterns 23 perform color conversion on the light of the second color penetrating the first blocking layer 21, and the second conversion patterns 33 perform color conversion on the light of the first color penetrating the second blocking layer 31, so that color images are displayed on the light exit surface 211 of the first conversion panel 20 and the light exit surface of the second conversion panel 30 respectively, and the double-sided display panel achieves double-sided display. The image displayed on the light exit surface 211 of the first conversion panel 20 may be the same as or different from the image displayed on the light exit surface 311 of the second conversion panel.

In addition, when the light-emitting units 101 in the light-emitting module 10 are configured to emit light of a third color other than the first color and the second color, light of the third color is capable of penetrating the first blocking layer 21 and the second blocking layer 31, and after the first conversion patterns 23 and the second conversion patterns 33 perform color conversion, a same color image can be displayed on the light exit surface 211 of the first conversion panel 20 and the light exit surface 311 of the second conversion panel 30.

The first conversion patterns 23 and the second conversion patterns 33 each are capable of converting the light emitted from the light-emitting units of the light emitting module 10 into a corresponding color, and a material of the first conversion patterns 23 and a material of the second conversion patterns 33 may be, for example, at least one of a quantum dot particle or a phosphor, but are not limited thereto. The main functions of the first light shielding layer 22 and the second light shielding layer 23 are to prevent a light source provided by the light-emitting module from leaking at unnecessary positions and to prevent the light converted by the first conversion patterns 23 and the second conversion patterns 33 from being mixed in color so as to increase the purity of the color and improve the display contrast. A material of the first light shielding layer 22 and a material of the second light shielding layer 32 may include a material having extremely low light transmittance. For example, the material of the first light shielding layer 22 and the material of the second light shielding layer 32 may include a black colorant, that is, the first light shielding layer 22 and the second light shielding layer 32 each may be a black matrix. At this time, the first light shielding layer 22 and the second light shielding layer 32 are capable of shielding light of all colors. As described above, the light-emitting units 101 in the light-emitting module 10 may not be limited to emit light of the first color and the second color, and may emit light of a color other than the first color and the second color.

In addition, the material of the first light shielding layer 22 may be the same as a material of the second blocking layer 31, and the material of the second light shielding layer 32 may be the same as a material of the first blocking layer 21. Thus, the cost of the double-sided display panel can be reduced and manufacturing process steps and structures of the double-sided display panel can be simplified. At this time, the first light shielding layer 22 can merely shield the light of the second color, and the second light shielding layer 32 can merely shield the light of the first color. Accordingly, the light-emitting units 101 may emit light of the first color and/or the second color. When the light-emitting units 101 emit light of the second color, at positions where light is not required to be emitted in the first conversion panel 20, the first light shielding layer 22 is capable of shielding the light of the second color penetrating the first blocking layer 21, and light of different colors and brightness converted by the first conversion pattern 23 are separated, so that an image with high contrast can be displayed on the light exit surface 211 of the first conversion panel 20. When the light-emitting units 101 emit light of the first color, at positions where light is not required to be emitted in the second conversion panel 30, the second light shielding layer 32 is capable of shielding the light of the first color penetrating the second blocking layer 31, and light of different colors and brightness converted by the second conversion pattern 33 are separated, so that an image with high contrast can be displayed on the light exit surface 311 of the second conversion panel 30.

The light-emitting module 10 of the double-sided display panel 100 provided in the embodiments of the present disclosure can provide light sources for the first conversion panel 20 and the second conversion panel 30. Since the first conversion pattern 23 of the first conversion panel 20 and the second conversion pattern 33 of the second conversion panel 30 each correspond, to at least one light-emitting unit 101 of the light-emitting module 10, the color and brightness of the light emitted by the light-emitting units 101 in the light-emitting module 10 can be controlled, so that the light emitted from the light-emitting units 101 penetrates the first blocking layer 21 and/or the second blocking layer 31 and is converted by the first conversion patterns 23 and/or the second conversion patterns 33, and then the color images can be displayed on the light exit surface 211 of the first conversion panel 20 and/or the light exit surface 311 of the second conversion panel 30, so that the double-sided display panel 100 can achieve single-sided display and double-sided display. In this way, compared with the double-sided display having two display screens in the related art, the double-sided display panel provided in the embodiments of the present disclosure has a simple structure and can meet a development requirement of the light, thin and small display device.

It is to be noted that FIGS. 1 and 2 are merely exemplary drawings of the embodiments of the present disclosure. As shown in FIG. 2, the first conversion pattern 23 and the second conversion pattern 33 each correspond to four light-emitting units 101 of the light-emitting module 10. In the embodiments of the present disclosure, the first conversion pattern 23 and the second conversion pattern 33 correspond to at least one light-emitting unit of the light-emitting module 10, that is, the first conversion pattern 23 and the second conversion pattern 33 may each correspond to one light-emitting unit, two light-emitting units, three light-emitting units, . . . . On the premise that the performance of the double-sided display panel 100 provided in the embodiments of the present disclosure can be met, the number of light-emitting units 101 corresponding to the first conversion pattern 23 and the second conversion pattern 33 is not specifically limited in the embodiments of the present disclosure.

Optionally, the first conversion panel includes a plurality of first conversion units. The first conversion pattern of the first conversion panel includes a first color conversion pattern, a second color conversion pattern and a third color conversion pattern. Each of the first conversion units includes at least one first color conversion pattern, at least one second color conversion pattern and at least one third color conversion pattern. The second conversion panel includes a plurality of second conversion units. The second conversion pattern of the second conversion panel includes the first color conversion pattern, the second color conversion pattern and the third color conversion pattern. Each of the second conversion units includes at least one first color conversion pattern, at least one second color conversion pattern and at least one third color conversion pattern. The first color conversion pattern is configured to convert light penetrating the first blocking layer or the second blocking layer into a first color, the second color conversion pattern is configured to convert the light penetrating the first blocking layer or the second blocking layer into a second color, and the third color conversion pattern is configured to convert the light penetrating the first blocking layer or the second blocking layer into a third color.

Figure 3:
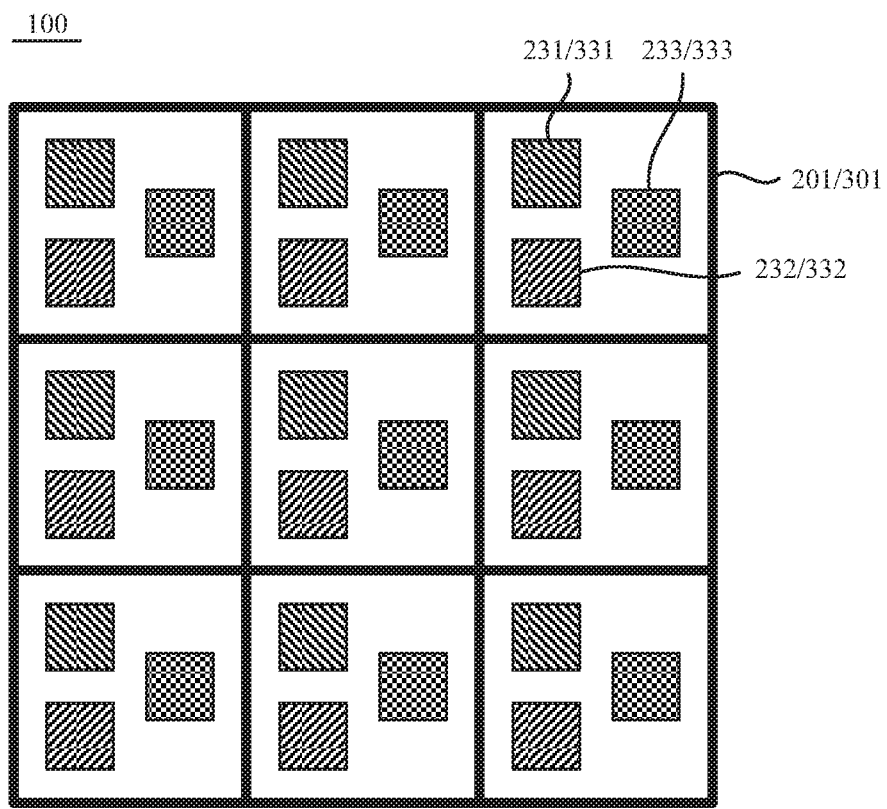
FIG. 3 is a top view of another double-sided display panel according to an embodiment of the present disclosure.
Figure 4:
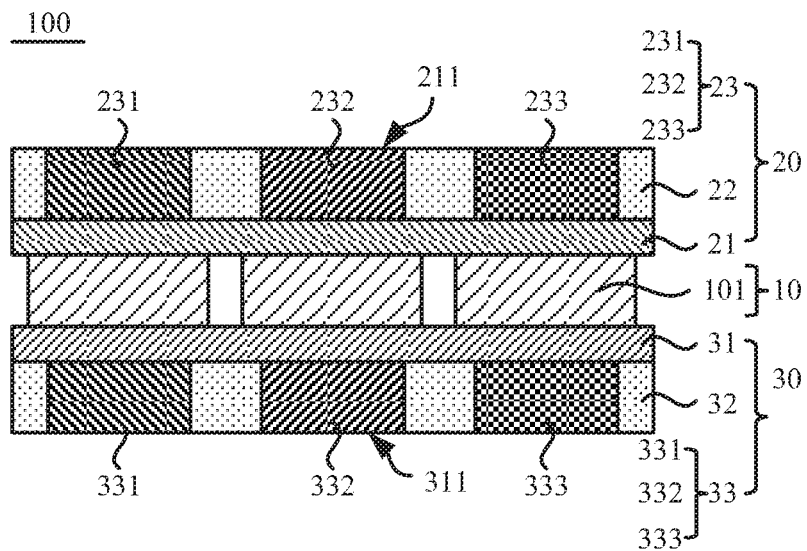
FIG. 4 is a schematic diagram illustrating a film layer structure of another double-sided display panel according to an embodiment of the present disclosure.

Exemplarily, FIG. 3 is top view of another double-sided display panel according to an embodiment of the present disclosure, and FIG. 4 is schematic diagram illustrating a film layer structure of another double-sided display panel according to an embodiment of the present disclosure. Referring to FIGS. 3 and 4, the first conversion panel 20 includes the plurality of first conversion units 201, and each of the first conversion units 201 includes a first color conversion pattern 231, a second color conversion pattern 232 and a third color conversion pattern 233. The light of colors other than the first color, emitted from the light-emitting units 101 in the light-emitting module 10, can penetrate the first blocking layer 21. The first color conversion pattern 231 of the first conversion pattern 23 is capable of converting the light penetrating the first blocking layer 21 into the first color, the second color conversion pattern 232 is capable of converting the light penetrating the first blocking layer 21 into the second color, and the third color conversion pattern 233 is capable of converting the light penetrating the first blocking layer 21 into the third color. Thus, the light of the first color converted by the first color conversion pattern 231, the light of the second color converted by the second color conversion pattern 232, and the light of the third color converted by the third color conversion pattern 233 may be mixed into light of different colors and brightness, so that a color image can be displayed on the light exit surface 211 of the first conversion panel 20.

Accordingly, the second conversion panel 30 includes a plurality of second conversion units 301, and each of the second conversion units 301 includes a first color conversion pattern 331, a second color conversion pattern 332 and a third color conversion pattern 333. The light of color other than other than the second color, emitted from the light-emitting units 101 in the light-emitting module 10, can penetrate the second blocking layer 31. The first color conversion pattern 331 of the second conversion pattern 33 is capable of converting the light penetrating the second blocking layer 31 into the first color, the second color conversion pattern 332 is capable of converting the light penetrating the second blocking layer 31 into the second color, and the third color conversion pattern 333 is capable of converting the light penetrating the second blocking layer 31 into the third color. Thus, the light of the first color converted by the first color conversion pattern 331, the light of the second color converted by the second color conversion pattern 332, and the light of the third color converted by the third color conversion pattern 333 may be mixed into light of different colors and brightness, so that a color image can be displayed on the light exit surface 311 of the second conversion panel 30.

Optionally, the first color may be any one of red, green or blue, the second color may be any one of red, green or blue, the third color may be any one of red, green or blue, and the first color, the second color and the third color are different colors. Thus, the first conversion unit 201 may be served as a pixel unit of the first conversion panel 20, the first color conversion pattern 231, the second color conversion pattern 232 and the third color conversion pattern 233 may be served as three sub-pixels in the pixel unit of the first conversion panel 20, and light of different colors emitted from the three sub-pixels can display a rich-color image based on the principle of three primary colors. Similarly, the second conversion unit 301 may be served as a pixel unit of the second conversion panel 30, the first color conversion pattern 331, the second color conversion pattern 332 and the third color conversion pattern 333 may be served as three sub-pixels in the pixel unit of the second conversion panel 30, and light of different colors emitted from the three sub-pixels can display a rich-color image based on the principle of three primary colors. Exemplarily, the first color may be red, the second color may be green and the third color may be blue. Accordingly, the light-emitting unit may emit light of red, green and blue.

In addition, the first conversion pattern 23 of the first conversion panel 20 may further include a conversion pattern that converts light penetrating the first blocking layer 21 into light of other colors. For example, the first conversion pattern 23 may further include a conversion pattern that converts the light penetrating the first blocking layer 21 into light of yellow and/or white etc. The second conversion pattern 33 of the second conversion panel 30 may further include a conversion pattern that converts light penetrating the second blocking layer 31 into light of other colors. For example, the second conversion pattern 33 may further include a conversion pattern that converts the light penetrating the second blocking layer 31 into light of yellow and/or white etc. Thus, color, brightness and contrast of the image displayed by the double-sided display panel can be enriched, and the display effect of the double-sided display panel can be improved.

It is to be noted that FIGS. 3 and 4 are merely exemplary drawings of the embodiments of the present disclosure. In FIG. 3, one first conversion unit 201 includes one first color conversion pattern 231, one second color conversion pattern 232 and one third color conversion pattern 233, and one second conversion unit 301 similarly includes one first color conversion pattern 331, one second color conversion pattern 332 and one third color conversion pattern 333. The numbers and arrangements of the first color conversion patterns, the second color conversion patterns, and the third color conversion patterns included in the first conversion unit 201 and the second conversion unit 301 provided in the embodiments of the present disclosure are not specifically limited. Simultaneously, when one light-emitting unit 101 of the light-emitting module 10 emits light of the first color, the second color and other colors, each conversion pattern may correspond to one light-emitting unit. In addition, each conversion pattern may correspond to at least two light-emitting units 101 on the premise that the double-sided display can be achieved, which is not limited in the embodiments of the present disclosure.

Figure 5:
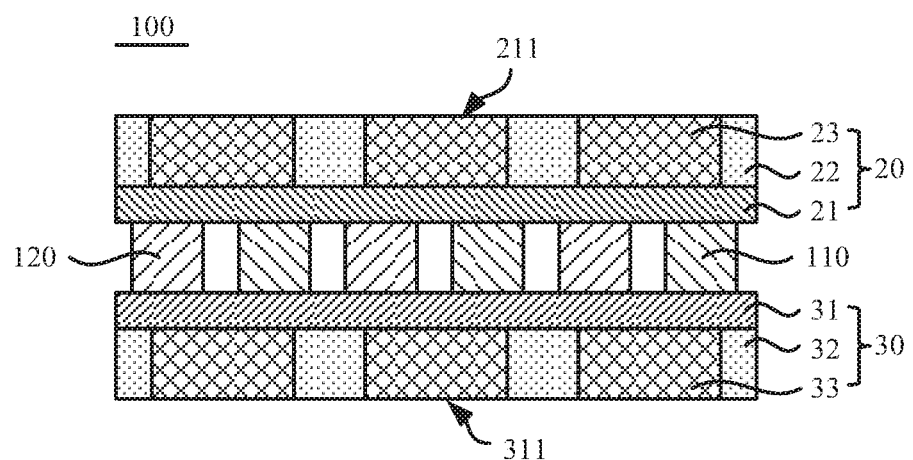
FIG. 5 is a schematic diagram illustrating a film layer structure of another double-sided display panel according to an embodiment of the present disclosure.
Figure 6:
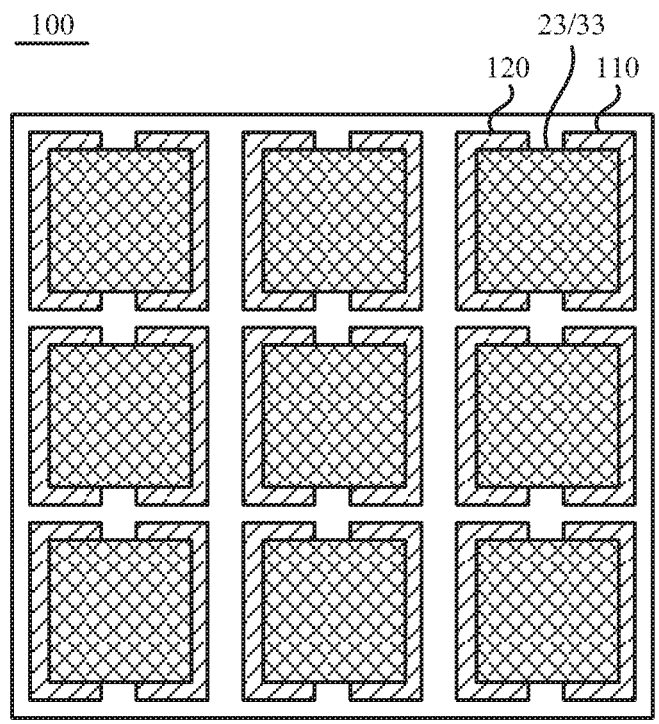
FIG. 6 is a top view of another double-sided display panel according to an embodiment of the present disclosure.

Optionally, FIG. 5 is a schematic diagram illustrating a film layer structure of a double-sided display panel according to an embodiment of the present disclosure, and FIG. 6 is a top view of another double-sided display panel according to an embodiment of the present disclosure. Referring to FIGS. 5 and 6, the light-emitting module includes a plurality of first light-emitting elements 110 and a plurality of second light-emitting elements 120, where the first light-emitting element 110 is configured to emit light of a first color, and the second light-emitting element 120 is configured to emit light of a second color.

Thus, light of the first color emitted from the first light-emitting element 110 can penetrate the second blocking layer 31 of the second conversion panel 30, and color conversion is performed via the second conversion pattern 33 so that a corresponding image is displayed on a light exit surface 311 of the second conversion panel 30; light of the second color emitted from the second light-emitting element 120 can penetrate the first blocking layer 21 of the first conversion panel 20, and color conversion is performed via the first conversion pattern 23 so that a corresponding image is displayed on a light exit surface 211 of the first conversion panel 20. When the first light-emitting elements 110 of the light-emitting module emit light and the second light-emitting elements 120 do not emit light, a corresponding image is displayed on the light exit surface 311 of the second conversion panel 30 of the double-sided display panel 100 while no image is displayed on the light exit surface 211 of the first conversion panel 20. When the second light-emitting elements 120 of the light-emitting module emit light and the first light-emitting elements 110 do not emit light, a corresponding image is displayed on the light exit surface 211 of the first conversion panel 20 of the double-sided display panel 100 while no image is displayed on the light exit surface 311 of the second conversion panel 30. When the first light-emitting elements 110 and the second light-emitting elements 120 of the light-emitting module emit light at the same time, images are displayed on the light exit surface 211 of the first conversion panel 20 and the light exit surface 311 of the second conversion panel 30 of the double-sided display panel 100, respectively.

Optionally, with continued reference to FIGS. 5 and 6, the first light-emitting element 110 of the light-emitting module emits light of any one of red, green or blue, and the second light-emitting element 120 of the light-emitting module emits light of any one of red, green or blue, and the first light-emitting element 110 and the second light-emitting element 120 are configured to emit light of different colors.

Exemplarily, the first light-emitting element 110 may emit red light, and the second light-emitting element 120 may emit blue light. Accordingly, the first blocking layer 21 of the first conversion panel 20 is a blocking layer of red light, and the first conversion pattern 23 is capable of performing color conversion on blue light penetrating the first blocking layer 21; and the second blocking layer 31 of the second conversion panel 30 is a blocking layer of blue light, and the second conversion pattern 33 can perform color conversion on red light penetrating the second blocking layer 31. Simultaneously, the first light shielding layer 22 of the first conversion panel 20 may shield the blue light, and the second light shielding layer 32 of the second conversion panel 30 may shield the red light.

In addition, the first light-emitting element 110 may emit green light, and the second light-emitting element 120 may emit blue light; or the first light-emitting element 110 may emit blue light, and the second light-emitting element 120 may emit red light; or the first light-emitting element 110 may emit red light, and the second light-emitting element 120 may emit green light; or the first light-emitting element 110 may emit blue light, and the second light-emitting element 120 may emit green light; or the first light-emitting element 110 may emit green light, and the second light-emitting element 120 may emit red light.

Optionally, the light-emitting module includes a plurality of light-emitting units, and each of the light-emitting units may include at least one first light-emitting element and at least one second light-emitting element. The first light-emitting element and the second light-emitting element are both an organic light-emitting diode.

Exemplarily, with continued reference to FIGS. 5 and 6, the light-emitting module includes the plurality of light-emitting units. The first conversion pattern 23 of the first conversion panel 20 and the second conversion pattern 33 of the second conversion panel 30 each correspond to one light-emitting unit, and each light-emitting unit may include one first light-emitting element 110 and one second light-emitting element 120. At this time, the first light-emitting element of different light-emitting units of the light-emitting module corresponds to a respective second conversion pattern 33 of the second conversion panel 30, and second light-emitting element of different light-emitting units of the light-emitting module corresponds to the first conversion patterns 23 of the first conversion panel 20. A corresponding image can be displayed on the light exit surface 311 of the second conversion panel 30 by controlling brightness of light of the first light-emitting element 110 in each light-emitting unit; accordingly, a corresponding image can be displayed on the light exit surface 211 of the first conversion panel 20 by controlling brightness of light of the second light-emitting element 120 in each light-emitting unit.

Optionally, the first light-emitting element 110 and the second light-emitting element 120 may be selected as an organic light-emitting diode. The organic light-emitting diode may include an anode, a cathode, and a light-emitting layer placed between the anode and the cathode. Accordingly, the light-emitting module further includes a driving circuit located on one side of the organic light-emitting diode. The anode of the organic light-emitting diode and the cathode of the organic light-emitting diode each are a transparent electrode. An orthographic projection of the driving circuit on the first conversion panel is not overlapped at least in part with an orthographic projection of the light-emitting layer of the organic light-emitting diode on the first conversion panel; similarly, an orthographic projection of the driving circuit on the second conversion panel is not overlapped at least in part with an orthographic projection of the light-emitting layer of the organic light-emitting diode on the second conversion panel.

Figure 7:
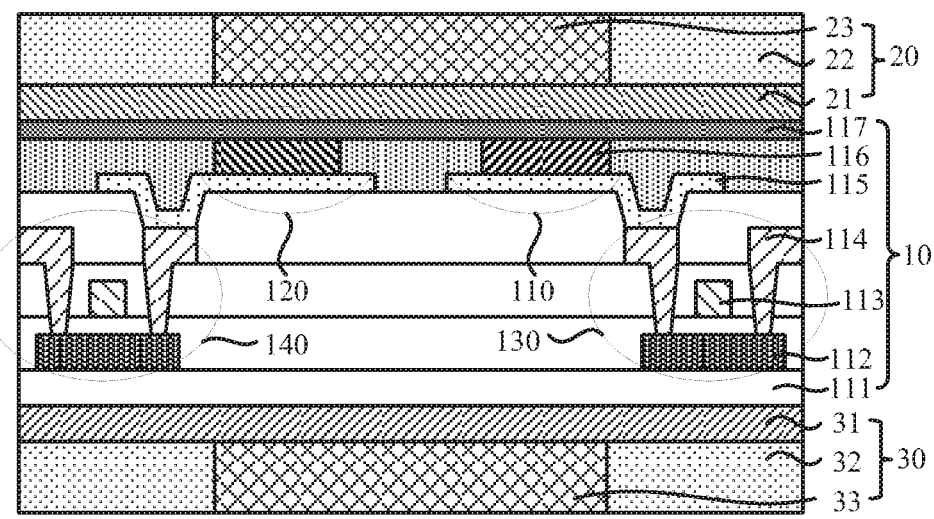
FIG. 7 is a schematic diagram illustrating a film layer structure of another double-sided display panel according to an embodiment of the present disclosure.

Exemplarily, FIG. 7 is a schematic diagram of a film layer structure of another double-sided display panel according to an embodiment of the present disclosure. As shown in FIG. 7, the first light-emitting element 110 and the second light-emitting element 120 of the light-emitting module 10 each are the organic light-emitting diode, at this time, the light-emitting module 10 may be equivalent to a double-sided light-emitting organic light-emitting display module. The organic light-emitting diode includes an anode 115, a cathode 117 and a light-emitting layer 116 placed between the anode 115 and the cathode 117. The light-emitting module 10 further includes a driving circuit 130 of the first light-emitting element 110 and a driving circuit 140 of the second light-emitting element 120. The driving circuit 130 and the driving circuit 140 may each include a plurality of transistors, memory elements, and other elements. In FIG. 7, the driving circuit 130 and the driving circuit 140 are each exemplarily shown to include one transistor. Transistors of the driving circuit 130 and the driving circuit 140 each include an active layer 112, a gate 113, and a source and drain 114. In addition, the light-emitting module further includes a base substrate 111 and a corresponding insulating layer, a pixel defining layer, and the like. The pixel defining layer is capable of defining a position of a light-emitting layer 116 in the organic light-emitting diode.

In order for light emitted from the first light-emitting element 110 to penetrate the second blocking layer 31 and light emitted from the second light-emitting element 120 to penetrate the first blocking layer 21, the anode 115 and the cathode 117 of the organic light-emitting diode may be provided as transparent electrodes, so that light emitted from the light-emitting layer 116 of the organic light-emitting diode can penetrate the anode 115 to reach the second conversion panel 30 and penetrate the cathode 117 to reach the first conversion panel 20. When the driving circuit 130 and the driving circuit 140 are located on a side of the organic light-emitting diode facing away from the first conversion panel 20, in order for the light emitted from the first light-emitting element 110 is capable of penetrating the second blocking layer 31 of the second conversion panel 30, an orthographic projection of the light-emitting layer 116 of the first light-emitting element 110 on the second conversion panel 30 should not be overlapped at least in part with an orthographic projection of the driving circuit 130 on the second conversion panel 30, so that the light emitted from the light-emitting layer 116 of the first light-emitting element 110 can reach the second conversion panel 30 after penetrating the anode 115. Alternatively, when the driving circuit 130 and the driving circuit 140 are located on a side of the organic light-emitting diode facing away from the second conversion panel 30, in order for the light emitted from a light-emitting layer 116 of the second light-emitting element 120 to penetrate the first blocking layer 21 of the first conversion panel 20, an orthographic projection of the light-emitting layer 116 of the second light-emitting element 120 on the first conversion panel 20 should not be overlapped at least in part with an orthographic projection of the driving circuit 140 on the first conversion panel 20, so that the light emitted from the light-emitting layer 116 of the second light-emitting element 120 can reach the first conversion panel 20 after penetrating the anode 115. Thus, the first conversion panel 20 and the second conversion panel 30 may be provided with light sources through the organic light-emitting display module having a simple structure, so that the double-sided display panel has a simple structure, which is beneficial for the development requirements of a light, thin and small double-sided display panel.

Figure 8:
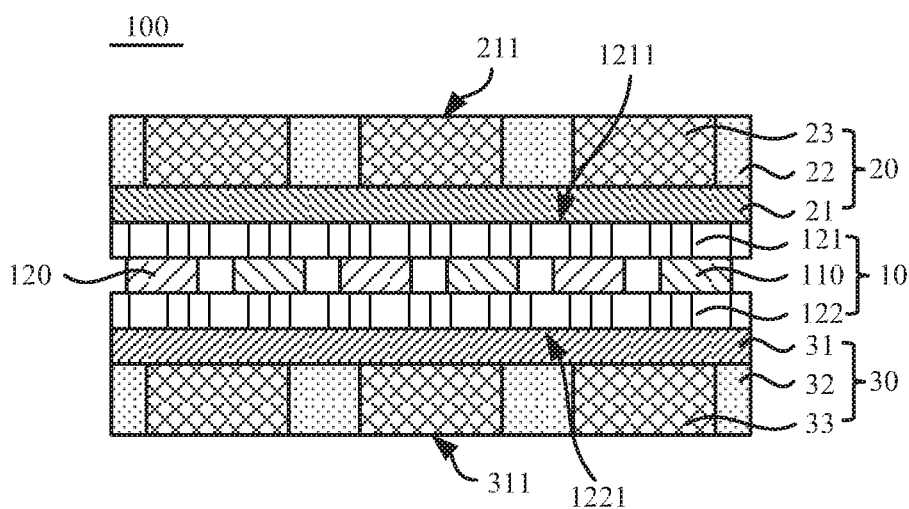
FIG. 8 is a schematic diagram illustrating a film layer structure of another double-sided display panel according to an embodiment of the present disclosure.

Optionally, FIG. 8 is a schematic diagram of a film layer structure of another double-sided display panel according to an embodiment of the present disclosure. As shown in FIG. 8, the light-emitting unit of the light-emitting module 10 includes at least one first light-emitting element 110 and at least one second light-emitting element 120. The light-emitting module 10 further includes a first light guide plate 121 and a second light guide plate 122. The first light-emitting element 110 and the second light-emitting element 120 are placed between the first light guide plate 121 and the second light guide plate 122. The first light guide plate 121 is placed between a plane where the first light-emitting element 110 and the second light-emitting element 120 are located and the first conversion panel 20. The second light guide plate 122 is placed between the plane where the first light-emitting element 110 and the second light-emitting element 120 are located and the second conversion panel 20.

Exemplarily, the light emitted from the second light-emitting element 120 of the light-emitting module 10 is transmitted through the first light guide plate 121 and irradiated to the first conversion panel 20, and penetrates the first blocking layer 21 of the first conversion panel 20, and then the first conversion pattern 23 performs color conversion on the light penetrating the first blocking layer 21, so that a corresponding image can be displayed on the light exit surface 211 of the first conversion panel 20. The light emitted from the first light-emitting element 110 of the light-emitting module 10 is transmitted through the second light guide plate 122 and irradiated to the second conversion panel 30, and penetrates the second blocking layer 31 of the second conversion panel 30, and then the second conversion pattern 33 performs color conversion on the light penetrating the second blocking layer 31, so that a corresponding image can be displayed on the light exit surface 311 of the second conversion panel 30. At this time, the light-emitting module 10 may be equivalent to a double-sided light-guide direct type backlight module, and the double-sided display panel 100 can provide light sources for the first conversion panel 20 and the second conversion panel 30 through a direct-type backlight module having a simple structure, so that the double-sided display panel has a simple structure, which is beneficial for the development requirements of a light, thin and small double-sided display panel.

It is to be noted that FIGS. 5, 6, 7 and 8 are merely exemplary drawings of the embodiments of the present disclosure. As shown in FIGS. 5 and 6, one light-emitting unit includes one first light-emitting element and one second light-emitting element. In addition, in the embodiments of the present disclosure, one light-emitting unit may include two or more first light-emitting elements and two or more second light-emitting elements, and the number of first light-emitting elements and the number of second light-emitting elements may be the same or different, which are not specially limited in the embodiments of the present disclosure. In addition, the driving circuit of the organic light-emitting diode may be provided in one-to-one correspondence with the organic light-emitting diode, or a plurality of organic light-emitting diodes may share one driving circuit, which is not specially limited in the embodiments of the present disclosure.

Optionally, the light-emitting unit of the light-emitting module includes at least one first pixel and at least one second pixel, and the light-emitting module further includes a light guide plate, a first liquid crystal panel and a second liquid crystal panel; the first light-emitting element and the second light-emitting element are located on a side surface of the light guide plate; the first liquid crystal panel is located on one side of the light guide plate facing towards the first conversion panel, the first liquid crystal panel includes a plurality of first pixels, and the first pixels are in one-to-one correspondence with the first conversion patterns of the first conversion panel; the second liquid crystal panel is located on one side of the light guide plate facing towards the second conversion panel, the second liquid crystal panel includes a plurality of second pixels, and the second pixels are in one-to-one correspondence with the second conversion patterns of the second conversion panel.

Figure 9:
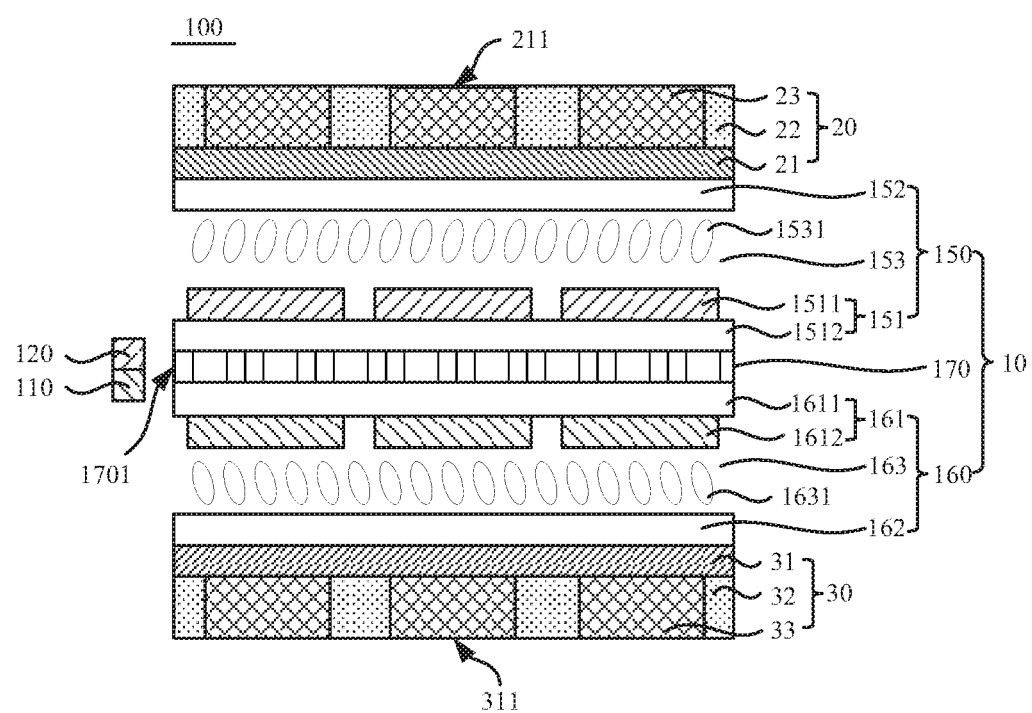
FIG. 9 is a schematic diagram illustrating a film layer structure of another double-sided display panel according to an embodiment of the present disclosure.

Exemplarily, FIG. 9 is a schematic diagram illustrating a film layer structure of a double-sided display panel according to an embodiment of the present disclosure. As shown in FIG. 9, the light-emitting module 10 may be equivalent to a double-sided light-guide edge type backlight module. The first light-emitting element 110 and the second light emitting element 120 of the light-emitting module 10 each are located on the side surface of the light guide plate 170, and the first light-emitting element 110 and the second light-emitting element 120 are not in direct contact with the light guide plate 170 but are fixed to corresponding support components. The first light-emitting element 110 and the second light-emitting element 120 may be alternately arranged in a same direction, or may be arranged up and down, which is not specially limited in the embodiments of the present disclosure.

In addition, the light-emitting module 10 further includes the first liquid crystal panel 150 and the second liquid crystal panel 160. The first liquid crystal panel 150 is located on one side of the light guide plate 170 facing towards the first conversion panel 20, and the second liquid crystal panel 160 is located on one side of the light guide plate 170 facing towards the second conversion panel 30. The first liquid crystal panel 150 includes a plurality of first pixels, structurally, the first liquid crystal panel 150 may include a first array substrate 151, a first opposite substrate 152, and a first liquid crystal layer 153 placed between the first array substrate 151 and the first opposite substrate 152. The first array substrate 151 includes a first substrate 1512 and a plurality of pixel electrode patterns 1511 located on one side of the first substrate close to the first liquid crystal layer 153, and one pixel electrode pattern 1511 may correspond to one first pixel of the first liquid crystal panel 150. The pixel electrode pattern 1511 of the first liquid crystal display panel 150 can cooperate with a common electrode (not shown in the figure) in the first liquid crystal panel 150 to control twisting of liquid crystal molecules 1531 of the first liquid crystal layer 153, and control the brightness of light transmitted through the light guide plate 170 at each first pixel of the first liquid crystal panel 150 according to the twisting situation of the liquid crystal molecules corresponding to each pixel electrode pattern 1511. The light emitted from the second light-emitting element 120 penetrating the first liquid crystal panel 150 can penetrate the first blocking layer 21 of the first conversion panel 20, and at the same time, the first conversion pattern 23 of the first conversion panel 20 is capable of performing color conversion on the light penetrating the first blocking layer 21, so that a corresponding image can be displayed on the light exit surface 211 of the first conversion panel 20.

Accordingly, the second liquid crystal panel 160 includes a plurality of second pixels, structurally, the second liquid crystal panel 160 may include a second array substrate 161, a second opposite substrate 162, and a second liquid crystal layer 163 placed between the second array substrate 161 and the second opposite substrate 162, the second array substrate 161 includes a second substrate 1512 and a plurality of pixel electrode patterns 1611 located on one side of the second substrate close to the second liquid crystal layer 163, and one pixel electrode pattern 1611 may correspond to one second pixel of the second liquid crystal panel 160. The pixel electrode pattern 1611 of the second liquid crystal panel 160 can cooperate with a common electrode (not shown in the figure) in the second liquid crystal panel 160 to control twisting of liquid crystal molecules 1631 of the second liquid crystal layer 163, and control the brightness of light transmitted through the light guide plate 170 at each second pixel of the second liquid crystal panel 160 according to the twisting situation of the liquid crystal molecules corresponding to each pixel electrode pattern 1611. The light emitted from the first light-emitting element 110 and penetrating the second liquid crystal panel 160 can penetrate the second blocking layer 31 of the second conversion panel 30, and at the same time, the second conversion pattern 33 of the second conversion panel 30 is capable of performing color conversion on the light penetrating the second blocking layer 31, so that a corresponding image can be displayed on the light exit surface 311 of the second conversion panel 30.

Optionally, the light guide plate 170 may be a double-sided transparent light guide film, and the double-sided transparent light guide film includes a first light exit surface and a second light exit surface disposed opposite to each other. The first light exit surface faces towards the first liquid crystal panel, and the second light exit surface faces towards the second liquid crystal panel. Thus, the double-sided light-guide can be achieved by using merely one light guide plate, and thereby a structure of the double-sided display panel can be simplified, the thickness of the double-sided display panel can be reduced, and the lightening and thinning of the double-sided display panel can be further facilitated.

In addition, the light guide plate of the light-emitting module may further include a first light guide plate and a second light guide plate. The first light guide plate has a light exit side facing towards the first liquid crystal panel and the second light guide plate has a light exit side facing towards the second liquid crystal panel.

Figure 10:
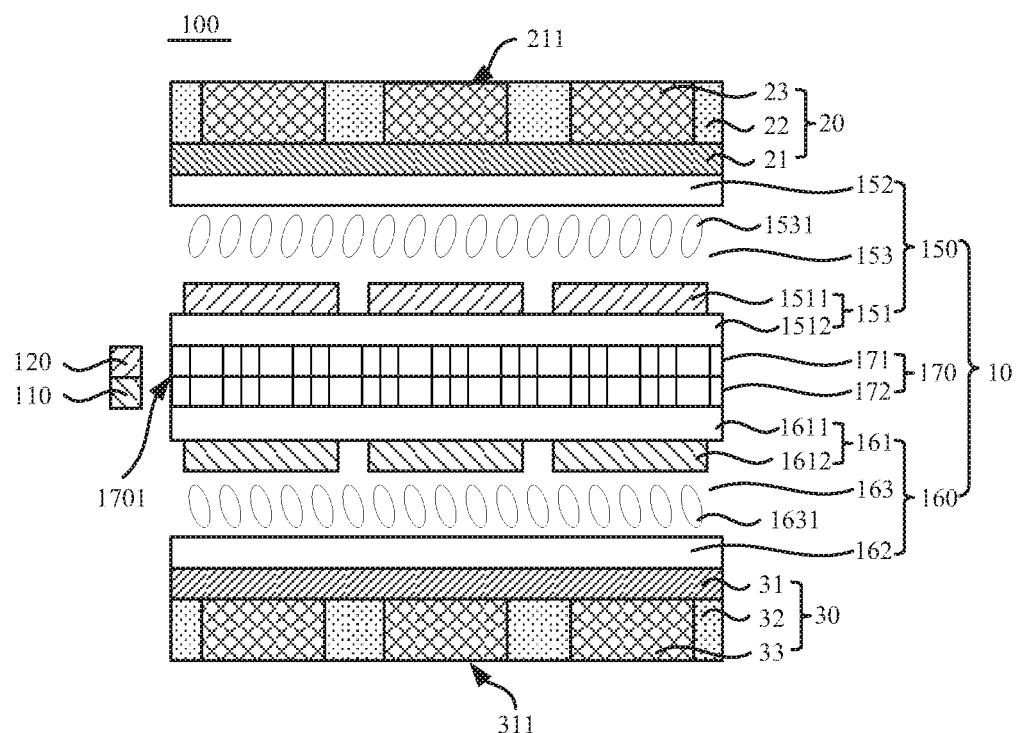
FIG. 10 is a schematic diagram illustrating a film layer structure of another double-sided display panel according to an embodiment of the present disclosure.

Exemplarily, FIG. 10 is a schematic diagram illustrating a film layer structure of another double-sided display panel according to an embodiment of the present disclosure. The same reference numerals in FIG. 10 as those in FIG. 9 denote the same structures, the same portions in FIG. 10 as those in FIG. 9 are not repeated herein, merely the difference between FIG. 10 and FIG. 9 are described, and reference may be made to FIG. 9 for other portions. The light guide plate of the light-emitting module 10 may further be a single-sided light guide plate, and the light guide plate 170 may include a first single-sided light guide plate 171 and a second single-sided light guide plate 172. A light exit surface of the first single-sided light guide plate 171 faces towards the first liquid crystal panel 150, and a light exit surface of the second single-sided light guide plate 172 faces towards the second liquid crystal panel 160. At this time, the first light-emitting element 110 may be disposed on a side edge of the second single-sided light guide plate 172, and the second light-emitting element 120 may be disposed on a side edge of the first single-sided light guide plate 171, so that the first single-sided light guide plate 171 can guide the light emitted from the second light-emitting element 120 to the light exit surface of the first single-sided light guide plate 171, and the second single-sided light guide plate 172 can guide the light emitted from the first light-emitting element 110 to the light exit surface of the second single-sided light guide plate 172.

A display device is further provided in the embodiments of the present disclosure and includes the double-sided display panel provided in the embodiments of the present disclosure, so the display device also has the beneficial effects of the double-sided display panel provided in the embodiments of the present disclosure, and the same portions can be understood by referring to the above description, and are not described in detail below.

Figure 11:
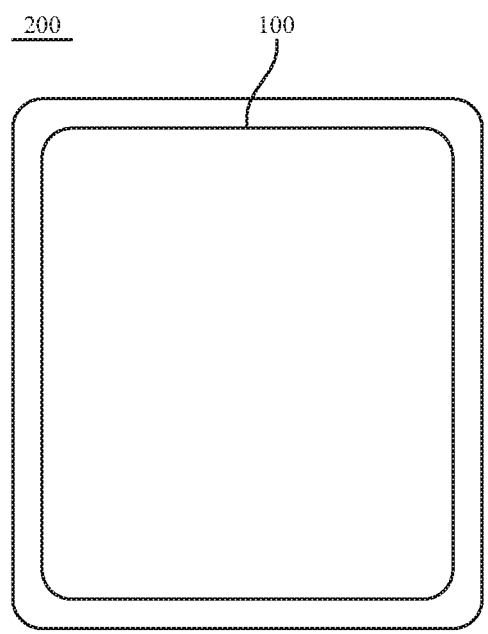
FIG. 11 is a structural diagram of a display device according to an embodiment of the present disclosure.

Exemplarily, FIG. 11 is a structural diagram of a display device according to an embodiment of the present disclosure. As shown in FIG. 11, a display device 200 includes a double-sided display panel 100, and the display device 200 may be, for example, a double-sided display mobile phone, tablet computer, or display, or the like.

Figure 12:
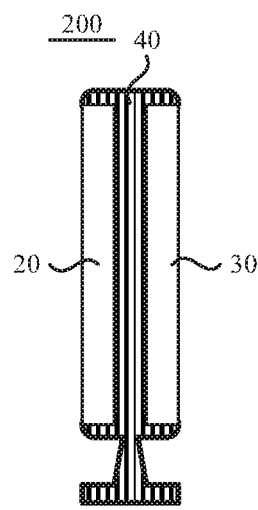
FIG. 12 is a side view of a display according to an embodiment of the present disclosure.

FIG. 12 is a side view of a display according to an embodiment of the present disclosure. As shown in FIG. 12, a display 200 includes the double-sided display panel, and the double-sided display panel includes a first conversion panel 20, a second conversion panel 30, a light-emitting module (not shown in the figure) placed between the first conversion panel 20 and the second conversion panel 30, a frame 40, and the like.

Optionally, the display device may further include a single-sided display panel. The single-sided display panel and the double-sided display panel are connected through a side edge, and the single-sided display panel and the double-sided display panel are foldable at the side edge. In a folded state, a display surface of the single-sided display panel faces towards a light exit surface of the second conversion panel. In an unfolded state, the display surface of the single-sided display panel faces the same direction as the light exit surface of the second conversion panel.

Figure 13:
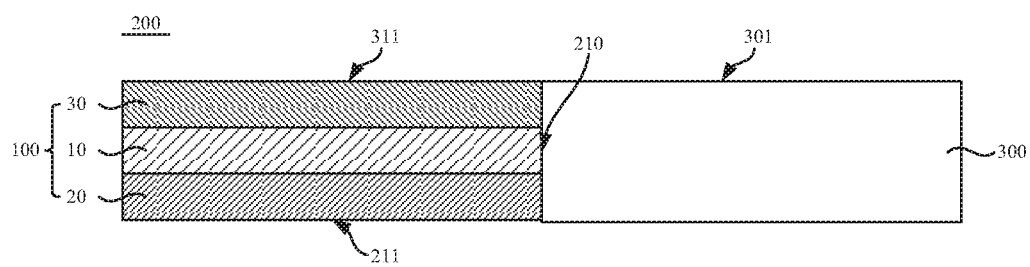
FIG. 13 is a schematic diagram illustrating a film layer structure of a display device in an unfolded state according to an embodiment of the present disclosure.
Figure 14:
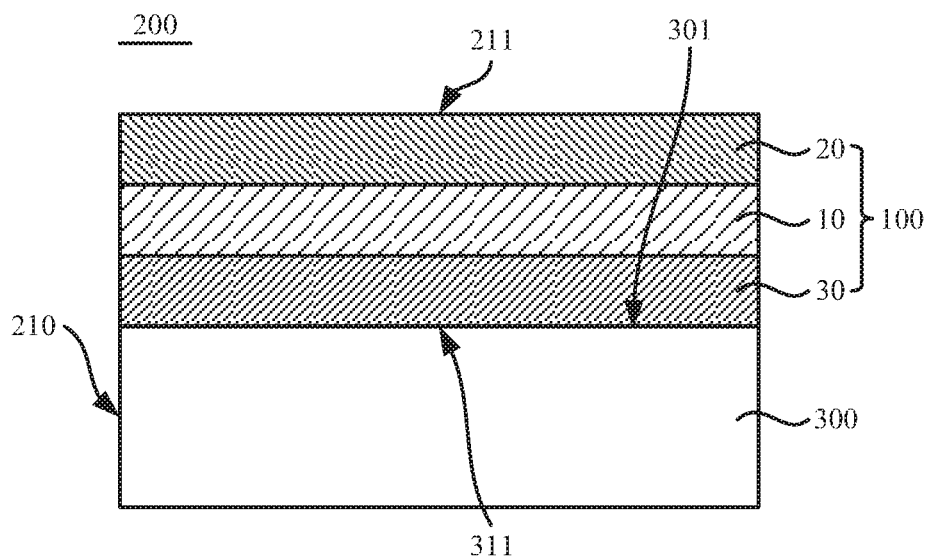
FIG. 14 is a schematic diagram illustrating a film layer structure of a display device in a folded state according to an embodiment of the present disclosure.

Exemplarily, FIG. 13 is a schematic diagram illustrating a film layer structure of a display device in an unfolded state according to an embodiment of the present disclosure, and FIG. 14 is a schematic diagram illustrating a film layer structure of a display device in a folded state according to an embodiment of the present disclosure. Referring to FIGS. 13 and 14, the display device 200 includes the double-sided display panel 100 and the single-sided display panel 300. The double-sided display panel 100 includes the first conversion panel 20, the second conversion panel 30 and the light-emitting module 10 placed between the first conversion panel 20 and the second conversion panel 30. The single-sided display panel 300 may be an organic light-emitting display panel, a liquid crystal display panel, or the like. The single-sided display panel 300 and the double-sided display panel 100 are connected through the side edge 210, and the single-sided display panel 300 and the double-sided display panel 100 are foldable at the side edge. In the folded state, the display surface 301 of the single-sided display panel 300 faces towards the light exit surface 311 of the second conversion panel 30, and at this time, an image may be displayed merely on the light exit surface 211 of the first conversion panel 20. In the unfolded state, the display surface 301 of the single-sided display panel 300 may face the same direction as the light exit surface 311 of the second conversion panel 30, and at this time, images may be simultaneously displayed on the light exit surface 311 of the second conversion panel 30 and the display surface of the single-sided display panel 300, and the image may not be displayed on the light exit surface 211 of the first conversion panel 20; or images are simultaneously displayed on the light exit surface 211 of the first conversion panel 20, the light exit surface 311 of the second conversion panel 30, and the display surface 301 of the single-sided display panel 300, which is not specifically limited in the embodiments of the present disclosure. A foldable display device 101 may be, for example, a foldable mobile phone, computer, wearable device, etc.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the inventive concept of the present disclosure. The scope of the present disclosure is determined by the scope of the appended claims.

What is claimed is:

1. A double-sided display panel, comprising: a first conversion panel, a second conversion panel, and a light-emitting module placed between the first conversion panel and the second conversion panel;
    wherein the light-emitting module comprises a plurality of light-emitting units, and the light-emitting module is configured to provide a light source for the first conversion panel and/or the second conversion panel;
    wherein the first conversion panel comprises a first blocking layer, a first light shielding layer and a plurality of first conversion patterns, wherein the first light shielding layer is located on a side of the first blocking layer facing away from the second conversion panel, the first light shielding layer comprises a plurality of first opening structures, and the first conversion patterns are located in the first opening structures; wherein each of the first conversion patterns corresponds to at least one of the light-emitting units;
    wherein the second conversion panel comprises a second blocking layer, a second light shielding layer and a plurality of second conversion patterns, wherein the second light shielding layer is located on a side of the second blocking layer facing away from the first conversion panel, the second light shielding layer comprises a plurality of second opening structures, and the second conversion patterns are located in the second opening structures; wherein each of the second conversion patterns corresponds to at least one of the light-emitting units;
    wherein the first blocking layer is configured to block light of a first color emitted from the light-emitting units, the first conversion patterns are configured to perform color conversion on light penetrating the first blocking layer, the second blocking layer is configured to block light of a second color emitted from the light-emitting units, and the second conversion patterns are configured to perform color conversion on light penetrating the second blocking layer, wherein the first color is different from the second color;
    wherein the first light shielding layer is merely capable of shielding light of the second color penetrating the first blocking layer, and the second light shielding layer is merely capable of shielding light of the first color penetrating the second blocking layer.

2. The double-sided display panel of claim 1, wherein the first conversion panel comprises a plurality of first conversion units, each of the first conversion patterns comprises a first color conversion pattern, a second color conversion pattern and a third color conversion pattern, and each of the first conversion units comprises at least one first color conversion pattern, at least one second color conversion pattern and at least one third color conversion pattern;
    wherein the second conversion panel comprises a plurality of second conversion units, each of the second conversion patterns comprises a first color conversion pattern, a second color conversion pattern and a third color conversion pattern, and each of the second conversion units comprises at least one first color conversion pattern, at least one second color conversion pattern and at least one third color conversion pattern; and
    wherein the first color conversion pattern of the first conversion panel is configured to convert light penetrating the first blocking layer into the first color, the first color conversion pattern of the second conversion panel is configured to convert light penetrating the second blocking layer into the first color, the second color conversion pattern of the first conversion panel is configured to convert the light penetrating the first blocking layer into the second color, the second color conversion pa of the second conversion panel is configured to convert the light penetrating the second blocking layer into the second color, the third color conversion pattern oft e first conversion panel is configured to convert the light penetrating the first blocking layer into a third color, and the third color conversion pattern of the second conversion panel is configured to convert the light penetrating the second blocking layer into the third color.

3. The double-sided display panel of claim 2, wherein the first color is any one of red, green or blue, the second color is any one of red, green or blue, and the third color is any one of red, green or blue;
    wherein the first color, the second color and the third color are different colors.

4. The double-sided display panel of claim 1, wherein a material of the first light shielding layer is the same as a material of the second blocking layer; and
    wherein a material of the second light shielding layer is the same as a material of the first blocking layer.

5. The double-sided display panel of claim 1, wherein each of the first conversion patterns and each of the second conversion patterns each comprise at least one of a quantum dot particle or a phosphor.

6. The double-sided display panel of claim 1, wherein the light-emitting module comprises a plurality of first light-emitting elements and a plurality of second light-emitting elements, each of the first light-emitting elements is configured to emit light of the first color, and each of the second light-emitting elements is configured to emit light of the second color.

7. The double-sided display panel of claim 6, wherein the first color is any one of red, green or blue, and the second color is any one of red, green or blue;
wherein the first color is different from the second color.

8. The double-sided display panel of claim 6, wherein each of the light-emitting units comprises at least one of the first light-emitting elements and at least one of the second light-emitting elements, and each of the first light-emitting elements and each of the second light-emitting elements each are an organic light-emitting diode.

9. The double-sided display panel of claim 8, wherein the organic light-emitting diode comprises an anode, a cathode and a light-emitting layer placed between the anode and the cathode;
wherein the light-emitting module further comprises a driving circuit located on a side of the organic light-emitting diode;
wherein the anode and the cathode each are a transparent electrode, and an orthographic projection of the driving circuit on the first conversion panel is not overlapped at least in part with an orthographic projection of the light-emitting layer on the first conversion panel.

10. The double-sided display panel of claim 6, wherein each of the light-emitting units comprises at least one of the first light-emitting elements and at least one of the second light-emitting elements;
wherein the light-emitting module further comprises a first light guide plate and a second light guide plate;
wherein the first light-emitting elements and the second light-emitting elements are placed between the first light guide plate and the second light guide plate;
wherein the first light guide is placed between a plane where the first light-emitting elements and the second light-emitting elements are located and the first conversion panel; and
wherein the second light guide is placed between the plane where the first light-emitting elements and the second light-emitting elements are located and the second conversion panel.

11. The double-sided display panel of claim 6, wherein each of the light-emitting units comprises at least one first pixel and at least one second pixel;
wherein the light-emitting module further comprises:
a light guide plate, wherein the first light-emitting elements and the second light-emitting elements are located on a side surface of the light guide plate;
a first liquid crystal panel located on a side of the light guide plate facing towards the first conversion panel, wherein the first liquid crystal panel comprises the at least one first pixel, and the at least one first pixel is arranged in one-to-one correspondence with the plurality of first conversion patterns; and
a second liquid crystal panel located on a side of the light guide plate facing towards the second conversion panel, wherein the second liquid crystal panel comprises the at least one second pixel, and the at least one second pixel is arranged in one-to-one correspondence with the plurality of second conversion patterns.

12. The double-sided display panel of claim 11, wherein the light guide plate comprises a first single-sided light guide plate and a second single-sided light guide plate;
wherein a light exit surface of the first single-sided light guide plate faces towards the first liquid crystal panel; and
wherein a light exit surface of the second single-sided light guide plate faces towards the second liquid crystal panel.

13. The double-sided display panel of claim 11, wherein the light guide plate comprises a double-sided transparent light guide film;
wherein the double-sided transparent light guide film comprises a first light exit surface and a second light exit surface which are disposed opposite to each other, the first light exit surface faces towards the first liquid crystal panel, and the second light exit surface faces towards the second liquid crystal panel.

14. A display device with a double-sided display panel, wherein the double-sided display panel comprises a first conversion panel, a second conversion panel, and a light-emitting module placed between the first conversion panel and the second conversion panel;
wherein the light-emitting module comprises a plurality of light-emitting units, and the light-emitting module is configured to provide a light source for the first conversion panel and/or the second conversion panel;
wherein the first conversion panel comprises a first blocking layer, a first light shielding layer and a plurality of first conversion patterns, wherein the first light shielding layer is located on a side of the first blocking layer facing away from the second conversion panel, the first light shielding layer comprises a plurality of first opening structures, and the first conversion patterns are located in the first opening structures; wherein each of the first conversion patterns corresponds to at least one of the light-emitting units;
wherein the second conversion panel comprises a second blocking layer, a second light shielding layer and a plurality of second conversion patterns, wherein the second light shielding layer is located on a side of the second blocking layer facing away from the first conversion panel, the second light shielding layer comprises a plurality of second opening structures, and the second conversion patterns are located in the second opening structures; wherein each of the second conversion patterns corresponds to at least one of the light-emitting units;
wherein the first blocking layer is configured to block light of a first color emitted from the light-emitting units, the first conversion patterns are configured to perform color conversion on light penetrating the first blocking layer, the second blocking layer is configured to block light of a second color emitted from the light-emitting units, and the second conversion patterns are configured to perform color conversion on light penetrating the second blocking layer, wherein the first color is different from the second color;
wherein the first light shielding layer is merely capable of shielding light of the second color penetrating the first blocking layer and the second light shielding layer is merely capable of shielding light of the first color penetrating the second blocking layer.

15. The display device of claim 14, wherein the first conversion panel comprises a plurality of first conversion units, each of the first conversion patterns comprises a first color conversion pattern, a second color conversion pattern and a third color conversion pattern, and each of the first conversion units comprises at least one first color conversion pattern, at least one second color conversion pattern and at least one third color conversion pattern;
wherein the second conversion panel comprises a plurality of second conversion units, each of the second conversion patterns comprises a first color conversion pattern, a second color conversion pattern and a third color conversion pattern, and each of the second conversion units comprises at least one first color conversion pattern, at least one second color conversion pattern and at least one third color conversion pattern; and wherein the first color conversion pattern of the first conversion panel is configured to convert light penetrating the first blocking layer into the first color, the first color conversion pattern of the second conversion panel is configured to convert light penetrating the second blocking layer into the first color, the second color conversion pattern of the first conversion panel is configured to convert the light penetrating the first blocking layer into the second color, the second color conversion pattern of the second conversion panel is configured to convert the light penetrating the second blocking layer into the second color, the third color conversion pattern of the first conversion panel is configured to convert the light penetrating the first blocking layer into a third color, and the third color conversion pattern of the second conversion panel is configured to convert the light penetrating the second blocking layer into the third color.

16. The display device of claim 15, wherein the first color is any one of red, green or blue, the second color is any one of red, green or blue, and the third color is any one of red, green or blue;

wherein the first color, the second color and the third color are different colors.

17. The display device of claim 14, wherein a material of the first light shielding layer is the same as a material of the second blocking layer; and wherein a material of the second light shielding layer is the same as a material of the first blocking layer.

18. The display device of claim 14, wherein each of the first conversion patterns and each of the second conversion patterns each comprise at least one of a quantum dot particle or a phosphor.

19. The display device of claim 14, wherein the light-emitting module comprises a plurality of first light-emitting elements and a plurality of second light-emitting elements, each of the first light-emitting elements is configured to emit light of the first color, and each of the second light-emitting elements is configured to emit light of the second color.

20. The display device of claim 14, further comprising: a single-sided display panel;

wherein the single-sided display panel and the double-sided display panel are connected through a side edge;

wherein the single-sided display panel and the double-sided display panel are foldable at the side edge; and wherein in a folded state, a display surface of the single-sided display panel faces towards a light exit surface of the second conversion panel; wherein in an unfolded state, the display surface of the single-sided display panel faces a same direction as the light exit surface of the second conversion panel.

* * * * *